(12) United States Patent
Lee et al.

(10) Patent No.: US 7,384,322 B2
(45) Date of Patent: Jun. 10, 2008

(54) APPARATUS AND METHOD FOR MANUFACTURING LIQUID CRYSTAL DISPLAY DEVICES

(75) Inventors: Sang Seok Lee, Taegu-kwangyokshi (KR); Sang Ho Park, Pusan-kwangyokshi (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/917,425

(22) Filed: Aug. 13, 2004

(65) Prior Publication Data

US 2005/0020177 A1     Jan. 27, 2005

Related U.S. Application Data

(63) Continuation of application No. 10/131,292, filed on Apr. 25, 2002, now Pat. No. 6,821,176.

(30) Foreign Application Priority Data

Feb. 22, 2002 (KR) .............................. P2002-9614

(51) Int. Cl.
*H01J 9/00* (2006.01)
(52) U.S. Cl. ............................. 445/23; 355/43; 349/148
(58) Field of Classification Search .................. 445/24, 445/25; 355/53, 54, 40, 143; 349/148, 79, 349/162
See application file for complete search history.

(56) References Cited

U.S. PATENT DOCUMENTS

| | | | |
|---|---|---|---|
| 3,978,580 A | 9/1976 | Leupp et al. | |
| 4,094,058 A | 6/1978 | Yasutake et al. | |
| 4,653,864 A | 3/1987 | Baron et al. | |
| 4,691,995 A | 9/1987 | Yamazaki et al. | |
| 4,775,225 A | 10/1988 | Tsuboyama et al. | |
| 5,247,377 A | 9/1993 | Omeis et al. | |
| 5,263,888 A | 11/1993 | Ishihara et al. | |
| 5,379,139 A | 1/1995 | Sato et al. | |
| 5,406,989 A | 4/1995 | Abe | |
| 5,499,128 A | 3/1996 | Hasegawa et al. | |
| 5,507,323 A | 4/1996 | Abe | |
| 5,511,591 A | 4/1996 | Abe | |
| 5,539,545 A | 7/1996 | Shimizu et al. | |
| 5,548,429 A | 8/1996 | Tsujita | |
| 5,642,214 A | 6/1997 | Ishii et al. | |
| 5,680,189 A | 10/1997 | Shimizu et al. | |
| 5,742,370 A | 4/1998 | Kim et al. | |
| 5,757,451 A | 5/1998 | Miyazaki | |
| 5,823,736 A | 10/1998 | Matsumura | |
| 5,852,484 A | 12/1998 | Inoue et al. | |

(Continued)

FOREIGN PATENT DOCUMENTS

CN     1234524     11/1999

(Continued)

*Primary Examiner*—Joseph Williams
(74) *Attorney, Agent, or Firm*—McKenna Long & Aldridge, LLP

(57) ABSTRACT

An apparatus for manufacturing a liquid crystal display device includes a unitary vacuum processing chamber, upper and lower stages confronting each other at upper and lower spaces inside the vacuum processing chamber to bond a first and second substrates, and a first substrate lifting system formed in the lower stage for lifting the second substrate.

38 Claims, 11 Drawing Sheets

U.S. PATENT DOCUMENTS

| | | |
|---|---|---|
| 5,854,664 A | 12/1998 | Inoue et al. |
| 5,861,932 A | 1/1999 | Inata |
| 5,875,922 A | 3/1999 | Chastine et al. |
| 5,952,676 A | 9/1999 | Sato et al. |
| 5,956,112 A | 9/1999 | Fujimori et al. |
| 6,001,203 A | 12/1999 | Yamada et al. |
| 6,011,609 A | 1/2000 | Kato et al. |
| 6,016,178 A | 1/2000 | Kataoka et al. |
| 6,016,181 A | 1/2000 | Shimada |
| 6,055,035 A | 4/2000 | Von Gutfeld et al. |
| 6,163,357 A | 12/2000 | Nakamura |
| 6,219,126 B1 | 4/2001 | Von Gutfeld |
| 6,226,067 B1 | 5/2001 | Nishiguchi et al. |
| 6,227,786 B1 | 5/2001 | Tateyama |
| 6,236,445 B1 | 5/2001 | Foschaar et al. |
| 6,304,306 B1 | 10/2001 | Shiomi et al. |
| 6,304,311 B1 | 10/2001 | Egami et al. |
| 6,337,730 B1 | 1/2002 | Ozaki et al. |
| 6,414,733 B1 | 7/2002 | Ishikawa et al. |
| 2001/0021200 A1 | 9/2001 | Egami |
| 2002/0008838 A1 | 1/2002 | Matsuda |

FOREIGN PATENT DOCUMENTS

| | | |
|---|---|---|
| EP | 1 003 066 A1 | 5/2000 |
| JP | 51-65656 | 6/1976 |
| JP | 57-038414 | 3/1982 |
| JP | 57-38414 | 3/1982 |
| JP | 57-88428 | 6/1982 |
| JP | 57-088428 | 6/1982 |
| JP | 58-27126 | 2/1983 |
| JP | 58-027126 | 2/1983 |
| JP | 59-057221 | 4/1984 |
| JP | 59-57221 | 4/1984 |
| JP | 59-195222 | 11/1984 |
| JP | 60-111221 | 6/1985 |
| JP | 60-164723 | 8/1985 |
| JP | 60-217343 | 10/1985 |
| JP | 61-7822 | 1/1986 |
| JP | 61-007822 | 1/1986 |
| JP | 61-055625 | 3/1986 |
| JP | 61-55625 | 3/1986 |
| JP | S62-054225 | 3/1987 |
| JP | S62-054228 | 3/1987 |
| JP | S62-054229 | 3/1987 |
| JP | 62-89025 | 4/1987 |
| JP | 62-089025 | 4/1987 |
| JP | 62-090622 | 4/1987 |
| JP | 62-90622 | 4/1987 |
| JP | 62-205319 | 9/1987 |
| JP | 63-109413 | 5/1988 |
| JP | 63-110425 | 5/1988 |
| JP | 63-128315 | 5/1988 |
| JP | 68-110425 | 5/1988 |
| JP | 63-311233 | 12/1988 |
| JP | H03-009549 | 1/1991 |
| JP | H05-036425 | 2/1993 |
| JP | H05-036426 | 2/1993 |
| JP | H05-107533 | 4/1993 |
| JP | 05-127179 | 5/1993 |
| JP | 5-127179 | 5/1993 |
| JP | 05-154923 | 6/1993 |
| JP | 5-154923 | 6/1993 |
| JP | 05-265011 | 10/1993 |
| JP | 5-265011 | 10/1993 |
| JP | 05-281557 | 10/1993 |
| JP | 5-281557 | 10/1993 |
| JP | 05-281562 | 10/1993 |
| JP | 5-281562 | 10/1993 |
| JP | H06-018829 | 1/1994 |
| JP | 06-051256 | 2/1994 |
| JP | 6-51256 | 2/1994 |
| JP | H06-064229 | 3/1994 |
| JP | 06-097269 | 4/1994 |
| JP | 6-148657 | 5/1994 |
| JP | 06-148657 | 5/1994 |
| JP | 06-160871 | 6/1994 |
| JP | 6-160871 | 6/1994 |
| JP | H06-194637 | 7/1994 |
| JP | 6-235925 | 8/1994 |
| JP | 06-235925 | 8/1994 |
| JP | 6-265915 | 9/1994 |
| JP | 06-265915 | 9/1994 |
| JP | 6-313870 | 11/1994 |
| JP | 06-313870 | 11/1994 |
| JP | 07-074231 | 3/1995 |
| JP | 07-084268 | 3/1995 |
| JP | 7-84268 | 3/1995 |
| JP | 7-128674 | 5/1995 |
| JP | 07-128674 | 5/1995 |
| JP | 07-181507 | 7/1995 |
| JP | 7-181507 | 7/1995 |
| JP | H07-275770 | 10/1995 |
| JP | H07-275771 | 10/1995 |
| JP | H08-076133 | 3/1996 |
| JP | 8-95066 | 4/1996 |
| JP | 08-095066 | 4/1996 |
| JP | 08-101395 | 4/1996 |
| JP | 8-101395 | 4/1996 |
| JP | 08-106101 | 4/1996 |
| JP | 8-106101 | 4/1996 |
| JP | H08-110504 | 4/1996 |
| JP | H08-136937 | 5/1996 |
| JP | 08-171094 | 7/1996 |
| JP | 8-171094 | 7/1996 |
| JP | 8-190099 | 7/1996 |
| JP | 08-190099 | 7/1996 |
| JP | H08-173874 | 7/1996 |
| JP | 8-240807 | 9/1996 |
| JP | 08-240807 | 9/1996 |
| JP | 08-241918 | 9/1996 |
| JP | 9-5762 | 1/1997 |
| JP | 09-005762 | 1/1997 |
| JP | 9-26578 | 1/1997 |
| JP | 09-026578 | 1/1997 |
| JP | H09-001026 | 1/1997 |
| JP | 09-311340 | 2/1997 |
| JP | 9-61829 | 3/1997 |
| JP | 09-61829 | 3/1997 |
| JP | 9-73075 | 3/1997 |
| JP | 09-073075 | 3/1997 |
| JP | 09-073096 | 3/1997 |
| JP | 9-73096 | 3/1997 |
| JP | H09-094500 | 4/1997 |
| JP | 9-127528 | 5/1997 |
| JP | 09-127528 | 5/1997 |
| JP | 09-160020 | 6/1997 |
| JP | 09-230357 | 9/1997 |
| JP | 9-230357 | 9/1997 |
| JP | 09-281511 | 10/1997 |
| JP | 9-281511 | 10/1997 |
| JP | 9-311340 | 12/1997 |
| JP | 10-064982 | 3/1998 |
| JP | 10-123537 | 5/1998 |
| JP | 10-123538 | 5/1998 |
| JP | 10-142616 | 5/1998 |
| JP | 10-177178 | 6/1998 |
| JP | H10-174924 | 6/1998 |
| JP | 10-221700 | 8/1998 |
| JP | 10-282512 | 10/1998 |
| JP | 10-308348 | 11/1998 |
| JP | 10-333157 | 12/1998 |
| JP | 10-333159 | 12/1998 |
| JP | 11-014953 | 1/1999 |

| | | | | | |
|---|---|---|---|---|---|
| JP | 11-14953 | 1/1999 | JP | 2001-215459 | 8/2001 |
| JP | 11-38424 | 2/1999 | JP | 2001-222017 | 8/2001 |
| JP | 11-038424 | 2/1999 | JP | 2001-235758 | 8/2001 |
| JP | 11-64811 | 3/1999 | JP | 2001-255542 | 9/2001 |
| JP | 11-064811 | 3/1999 | JP | 2001-264782 | 9/2001 |
| JP | 11-109388 | 4/1999 | JP | 2001-272640 | 10/2001 |
| JP | 11-133438 | 5/1999 | JP | 2001-281675 | 10/2001 |
| JP | 11-142864 | 5/1999 | JP | 2001-281678 | 10/2001 |
| JP | 11-174477 | 7/1999 | JP | 2001-282126 | 10/2001 |
| JP | 11-204430 | 7/1999 | JP | 2001-305563 | 10/2001 |
| JP | 11-212045 | 8/1999 | JP | 2001-326272 | 11/2001 |
| JP | 11-248930 | 9/1999 | JP | 2001-330837 | 11/2001 |
| JP | H11-262712 | 9/1999 | JP | 2001-330840 | 11/2001 |
| JP | H11-264991 | 9/1999 | JP | 2001-356353 | 12/2001 |
| JP | 11-326922 | 11/1999 | JP | 2001-356354 | 12/2001 |
| JP | 11-344714 | 12/1999 | JP | 2002-14360 | 1/2002 |
| JP | 2000-002879 | 1/2000 | JP | 2002-014360 | 1/2002 |
| JP | 2000-2879 | 1/2000 | JP | 2002-023176 | 1/2002 |
| JP | 2000-018207 | 1/2000 | JP | 2002-23176 | 1/2002 |
| JP | 2000-29035 | 1/2000 | JP | 2002-40398 | 2/2002 |
| JP | 2000-029035 | 1/2000 | JP | 2002-49045 | 2/2002 |
| JP | 2000-056311 | 2/2000 | JP | 2002-049045 | 2/2002 |
| JP | 2000-56311 | 2/2000 | JP | 2002-079160 | 3/2002 |
| JP | 2000-66165 | 3/2000 | JP | 2002-080321 | 3/2002 |
| JP | 2000-066165 | 3/2000 | JP | 2002-82340 | 3/2002 |
| JP | 2000-066218 | 3/2000 | JP | 2002-082340 | 3/2002 |
| JP | 2000-093866 | 4/2000 | JP | 2002-90759 | 3/2002 |
| JP | 2000-137235 | 5/2000 | JP | 2002-090759 | 3/2002 |
| JP | 2000-147528 | 5/2000 | JP | 2002-090760 | 3/2002 |
| JP | 2000-193988 | 7/2000 | JP | 2002-90760 | 3/2002 |
| JP | 2000-241824 | 9/2000 | JP | 2002-107740 | 4/2002 |
| JP | 2000-284295 | 10/2000 | JP | 2002-122870 | 4/2002 |
| JP | 2000-292799 | 10/2000 | JP | 2002-122872 | 4/2002 |
| JP | 2000-310759 | 11/2000 | JP | 2002-122873 | 4/2002 |
| JP | 2000-310784 | 11/2000 | JP | 2002-131762 | 5/2002 |
| JP | 2000-338501 | 12/2000 | JP | 2002-139734 | 5/2002 |
| JP | 2001-5401 | 1/2001 | JP | 2002-156518 | 5/2002 |
| JP | 2001-005401 | 1/2001 | JP | 2002-169166 | 6/2002 |
| JP | 2001-5405 | 1/2001 | JP | 2002-169167 | 6/2002 |
| JP | 2001-005405 | 1/2001 | JP | 2002-182222 | 6/2002 |
| JP | 2001-13506 | 1/2001 | JP | 2002-202512 | 7/2002 |
| JP | 2001-013506 | 1/2001 | JP | 2002-202514 | 7/2002 |
| JP | 2001-33793 | 2/2001 | JP | 2002-214626 | 7/2002 |
| JP | 2001-033793 | 2/2001 | JP | 2002-229042 | 8/2002 |
| JP | 2001-042341 | 2/2001 | JP | 2002-236276 | 8/2002 |
| JP | 2001-42341 | 2/2001 | JP | 2002-258299 | 8/2002 |
| JP | 2001-051284 | 2/2001 | JP | 2002-236292 | 9/2002 |
| JP | 2001-51284 | 2/2001 | JP | 2002-277865 | 9/2002 |
| JP | 2001-66615 | 3/2001 | JP | 2002-277866 | 9/2002 |
| JP | 2001-066615 | 3/2001 | JP | 2002-277881 | 9/2002 |
| JP | 2001-091727 | 4/2001 | JP | 2002-287156 | 10/2002 |
| JP | 2001-91727 | 4/2001 | JP | 2002-296605 | 10/2002 |
| JP | 2001-117105 | 4/2001 | JP | 2002-311438 | 10/2002 |
| JP | 2001-117109 | 4/2001 | JP | 2002-311440 | 10/2002 |
| JP | 2001-133745 | 5/2001 | JP | 2002-311442 | 10/2002 |
| JP | 2001-133794 | 5/2001 | JP | 2002-323687 | 11/2002 |
| JP | 2001-133799 | 5/2001 | JP | 2002-323694 | 11/2002 |
| JP | 2001-142074 | 5/2001 | JP | 2002-333628 | 11/2002 |
| JP | 2001-147437 | 5/2001 | JP | 2002-333635 | 11/2002 |
| JP | 2001-154211 | 6/2001 | JP | 2002-333843 | 11/2002 |
| JP | 2001-166272 | 6/2001 | JP | 2002-341329 | 11/2002 |
| JP | 2001-166310 | 6/2001 | JP | 2002-341355 | 11/2002 |
| JP | 2001-183683 | 7/2001 | JP | 2002-341356 | 11/2002 |
| JP | 2001-201750 | 7/2001 | JP | 2002-341357 | 11/2002 |
| JP | 2001-209052 | 8/2001 | JP | 2002-341358 | 11/2002 |
| JP | 2001-209056 | 8/2001 | JP | 2002-341359 | 11/2002 |
| JP | 2001-209057 | 8/2001 | JP | 2002-341362 | 11/2002 |
| JP | 2001-209058 | 8/2001 | KR | 2000-0035302 | 6/2000 |
| JP | 2001-209060 | 8/2001 | | | |

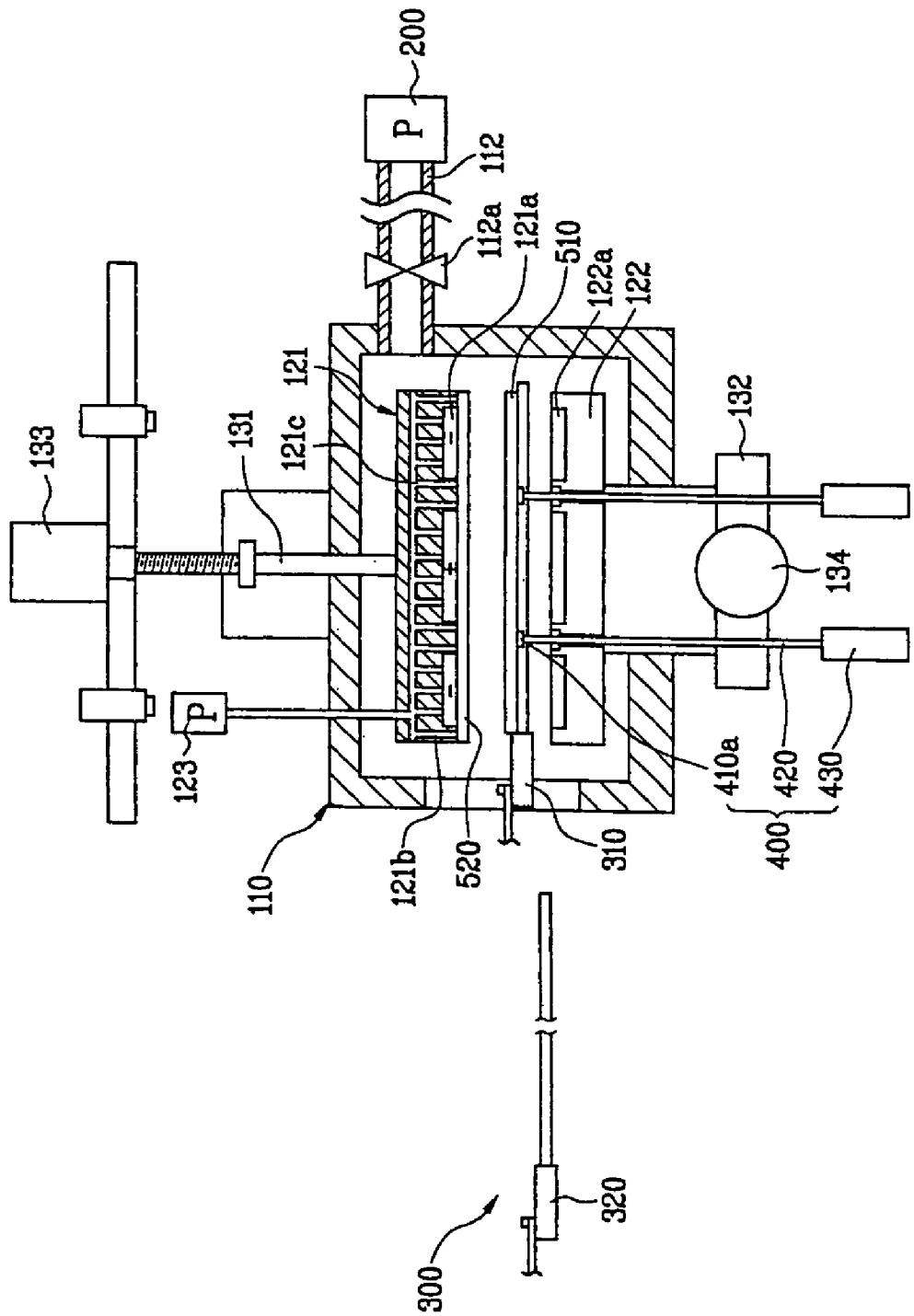

APPARATUS AND METHOD FOR MANUFACTURING LIQUID CRYSTAL DISPLAY DEVICES

This application is a continuation of Ser. No. 10/131,292 filed Apr. 25, 2005 now U.S. Pat. No. 6,821,176

The present invention claims the benefit of Korean Patent Application No. P2002-9614 filed in Korea on Feb. 22, 2002, which is hereby incorporated by reference.

BACKGROUND OF THE INVENTION

1. Field of the Invention

The present invention relates to a manufacturing apparatus, and more particularly, to an apparatus for manufacturing a liquid crystal display suitable for a large-sized liquid crystal display.

2. Discussion of the Related Art

In general, recent developments in the information communication field have increased demand for various types of displays devices. In response to this demand, various flat panel type displays such as liquid crystal display (LCD), plasma display panel (PDP), electro-luminescent display (ELD), and vacuum fluorescent display (VFD) have been developed to replace conventional cathode ray tube (CRT) devices. In particular, LCD devices have been used because of their high resolution, light weight, thin profile, and low power consumption. In addition, LCD devices have been implemented in mobile devices such as monitors for notebook computers. Furthermore, LCD devices have been developed for monitors of computer and television to receive and display broadcasting signals.

Accordingly, efforts to improve image quality of LCD devices contrast with the benefits of their high resolution, light weight, thin profile, and low power consumption. In order to incorporate LCD devices as a general image display, image quality such as fineness, brightness, large-sized area, for example, must be realized.

A plurality of gate lines are formed along one direction at fixed intervals on the first glass substrate (TFT array substrate), and a plurality of data lines are formed along a second direction perpendicular to one direction of the plurality of gate lines, thereby defining a plurality of pixel regions. Then, a plurality of pixel electrodes are formed in a matrix arrangement at the pixel regions, and a plurality of thin film transistors (TFT) are formed at the pixel regions. Accordingly, the plurality of thin film transistors are switched by signals transmitted along the gate lines and transfer signals transmitted along the data lines to each pixel electrode. In order to prevent light leakage, black matrix films are formed on the second glass substrate (color filter substrate) except at regions of the second glass substrate that correspond to the pixel regions of the first glass substrate.

A process for manufacturing an LCD device using a TFT substrate and a color filter substrate will be described with reference to a manufacturing apparatus according to the related art.

The process for manufacturing an LCD device according to the related art includes steps of forming a sealant pattern on one of a first and second substrate to form an injection inlet, bonding the first and second substrates to each other within a vacuum processing chamber, and injecting liquid crystal material through the injection inlet. In another process of manufacturing an LCD device according to the related art, a liquid crystal dropping method, which is disclosed in Japanese Patent Application No. 11-089612 and 11-172903, includes steps of dropping liquid crystal material on a first substrate, arranging a second substrate over the first substrate, and moving the first and second substrates, thereby bonding the first and second substrates to each other. Compared to the liquid crystal injection method, the liquid crystal dropping method is advantageous in that various steps such as, formation of a liquid crystal material injection inlet, injection of the liquid crystal material, and sealing of the injection inlet are unnecessary since the liquid crystal material is predisposed on the first substrate.

FIGS. 1 and 2 show cross sectional views of a substrate bonding device using the liquid crystal dropping method according to the related art. In FIG. 1, the substrate bonding device includes a frame 10, an upper stage 21, a lower stage 22, a sealant dispensor (not shown), a liquid crystal material dispensor 30, a processing chamber includes an upper chamber unit 31 and a lower chamber unit 32, a chamber moving system 40, and a stage moving system 50. The chamber moving system 40 includes a driving motor driven to selectively move the lower chamber unit 32 to a location at which the bonding process is carried out, or to a location at which outflow of the sealant occurs and dropping of the liquid crystal material. The stage moving system 50 includes another driving motor driven to selectively move the upper stage 21 along a vertical direction perpendicular to the upper and lower stages 21 and 22.

A process of manufacturing a liquid crystal display device using the substrate assembly device according to the prior art follows. First, a second substrate 52 is loaded upon the upper stage 21, and a first substrate 51 is loaded upon the lower stage 22. Then, the lower chamber unit 32 having the lower stage 22 is moved to a processing location by the chamber moving system 40 for sealant dispensing and liquid crystal material dispensing. Subsequently, the lower chamber unit 32 is moved to a processing location for substrate bonding by the chamber moving system 40. Thereafter, the upper and lower chamber units 31 and 32 are assembled together by the chamber moving system 40 to form a vacuum tight seal, and a pressure in the chamber is reduced by a vacuum generating system (not shown).

Then, the upper stage 21 is moved downwardly by the stage moving system 50 at the above-mentioned vacuum state so as to closely fasten the second substrate 52 fixed to the upper stage 21 to the first substrate 51 fixed to the lower stage 22. Further, the process for bonding the respective substrates to each other is carried out through a continuous pressurization, thereby completing the manufacture of the LCD device.

However, the substrate assembly device according to the prior art is problematic. First, the substrate assembly device according the prior art fails to provide a subsidiary system or device for stable loading of the substrate at the lower stage or unloading the bonded substrates from the lower stage, thereby creating a high probability that damage to the substrate(s) may occur during the loading/unloading process. Specifically, the bonded substrates may adhere to an upper surface of the lower stage during the bonding process. Second, when the bonded substrates are unloaded, central or circumferential portions of the bonded substrates will be free of droop. Specifically, considering that the size of LCD devices are increasing to meet demand, preventing droop during unloading of the bonded substrates is extremely important and necessary.

SUMMARY OF THE INVENTION

Accordingly, the present invention is directed to an apparatus and method for manufacturing liquid crystal display devices, method for using the apparatus, and device produced by the method that substantially obviates one or more problems due to limitations and disadvantages of the related art.

An object of the present invention is to provide an apparatus and method for manufacturing a liquid crystal display device suitable for fabrication of large-scaled LCD devices.

Additional features and advantages of the invention will be set forth in part in the description which follows, and in part will be apparent from the description, or may be learned from practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an apparatus for manufacturing a liquid crystal display device includes a unitary vacuum processing chamber, upper and lower stages confronting each other at upper and lower spaces inside the vacuum processing chamber to bond a first and second substrates, and a first substrate lifting system formed in the lower stage for lifting the second substrate.

In another aspect, a method for manufacturing a liquid crystal display device includes placing a substrate on a first substrate lifting system by moving the first substrate lifting system along an upward direction, and placing the substrate on an upper surface of a lower stage by moving the first substrate lifting system along a downward direction.

In another aspect, a method for manufacturing a liquid crystal display device includes placing a substrate on one of a first and second substrate lifting system by moving the one of the first and second substrate lifting systems along an upward and direction, and placing the substrate on an upper surface of a lower stage by moving the one of the first and second substrate lifting systems along a downward direction.

In another aspect, a method for manufacturing a liquid crystal display device includes placing a substrate on a first substrate lifting system by moving the first substrate lifting system along an upward direction, moving a second substrate lifting system along the upward direction to support the substrate together with the second substrate lifting system, and placing the substrate on an upper surface of a lower stage by moving the first and second substrate lifting systems along a downward direction.

In another aspect, a method for manufacturing a liquid crystal display device includes placing a substrate on a first substrate lifting system by moving the first substrate lifting system along an upward direction, moving a second substrate lifting system along the upward direction to support the substrate together with the first substrate lifting system, and placing the substrate on an upper surface of a lower stage by moving the first and second substrate lifting systems along a downward direction.

In another aspect, a liquid crystal display device manufactured by a method includes placing a substrate on one of a first and second substrate lifting system by moving the one of the first and second substrate lifting systems along an upward and direction, and placing the substrate on an upper surface of a lower stage by moving the one of the first and second substrate lifting systems along a downward direction.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principle of the invention. In the drawings:

FIG. 7A shows a cross sectional view of an exemplary substrate lifting system according to the present invention;

DETAILED DESCRIPTION OF THE INVENTION

Reference will now be made in detail to the preferred embodiments of the present invention, examples of which are illustrated in the accompanying drawings.

Figure 1:
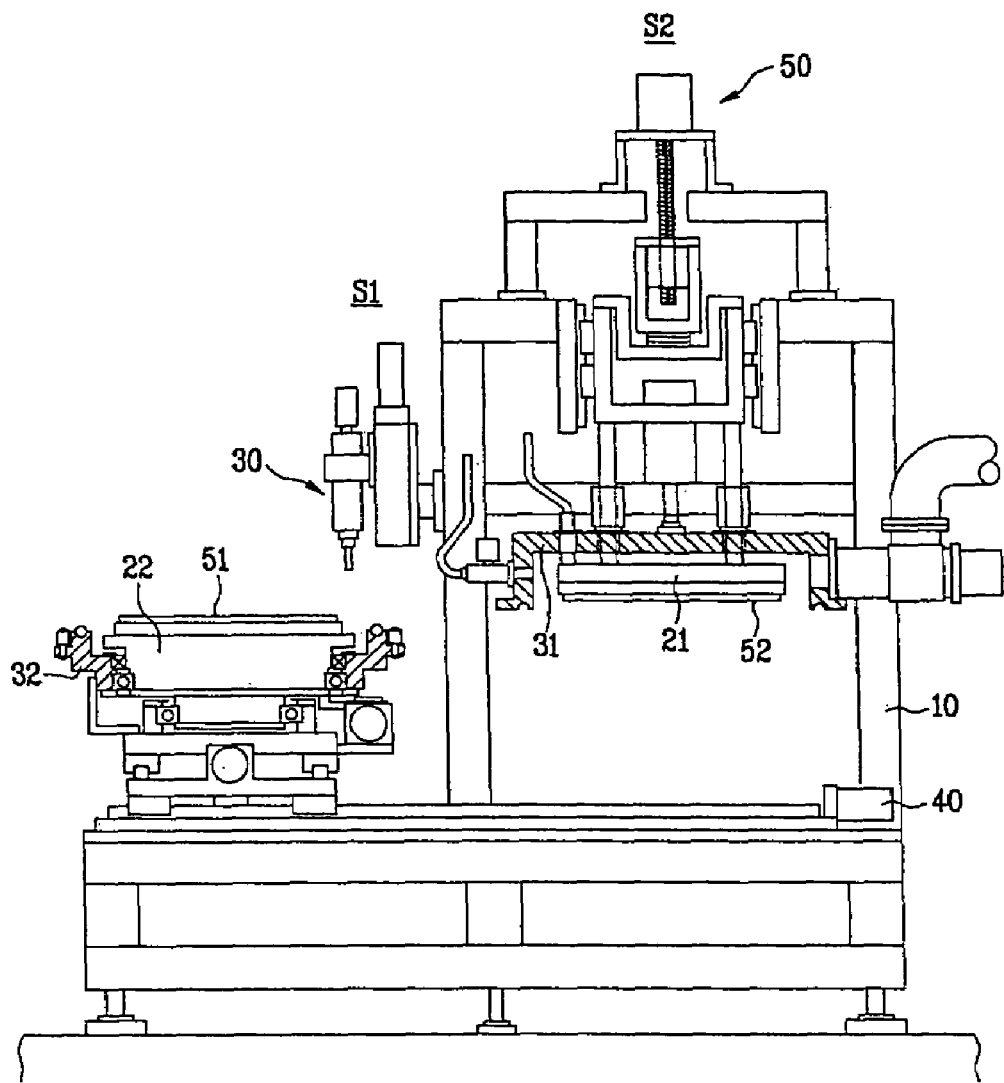
FIG. 1 shows a cross sectional view of a substrate bonding device prior to sealing of upper and lower chamber units according to the prior art.
Figure 2:
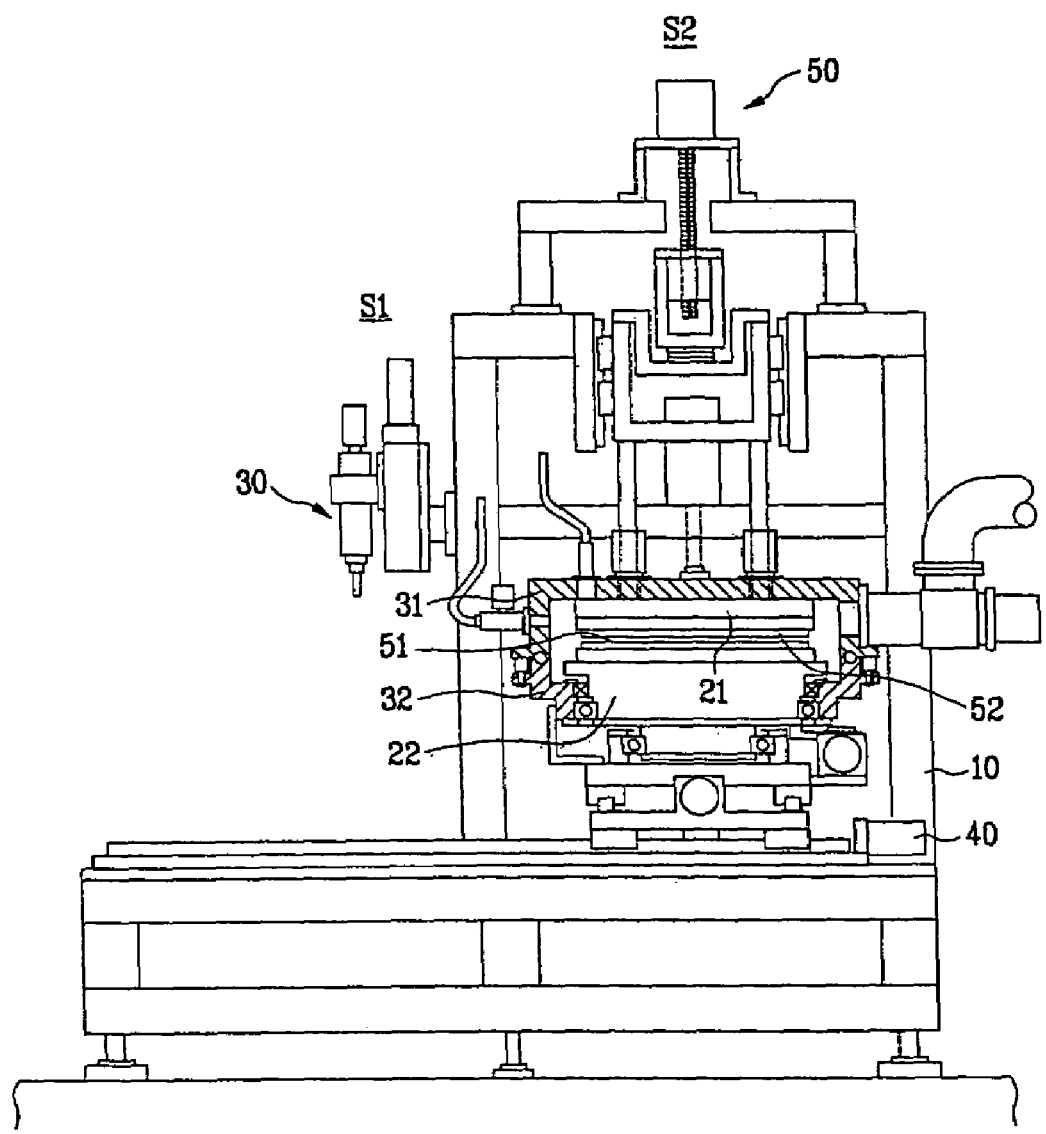
FIG. 2 shows a cross sectional view of the substrate bonding device during substrate bonding according to the prior art.
Figure 3:
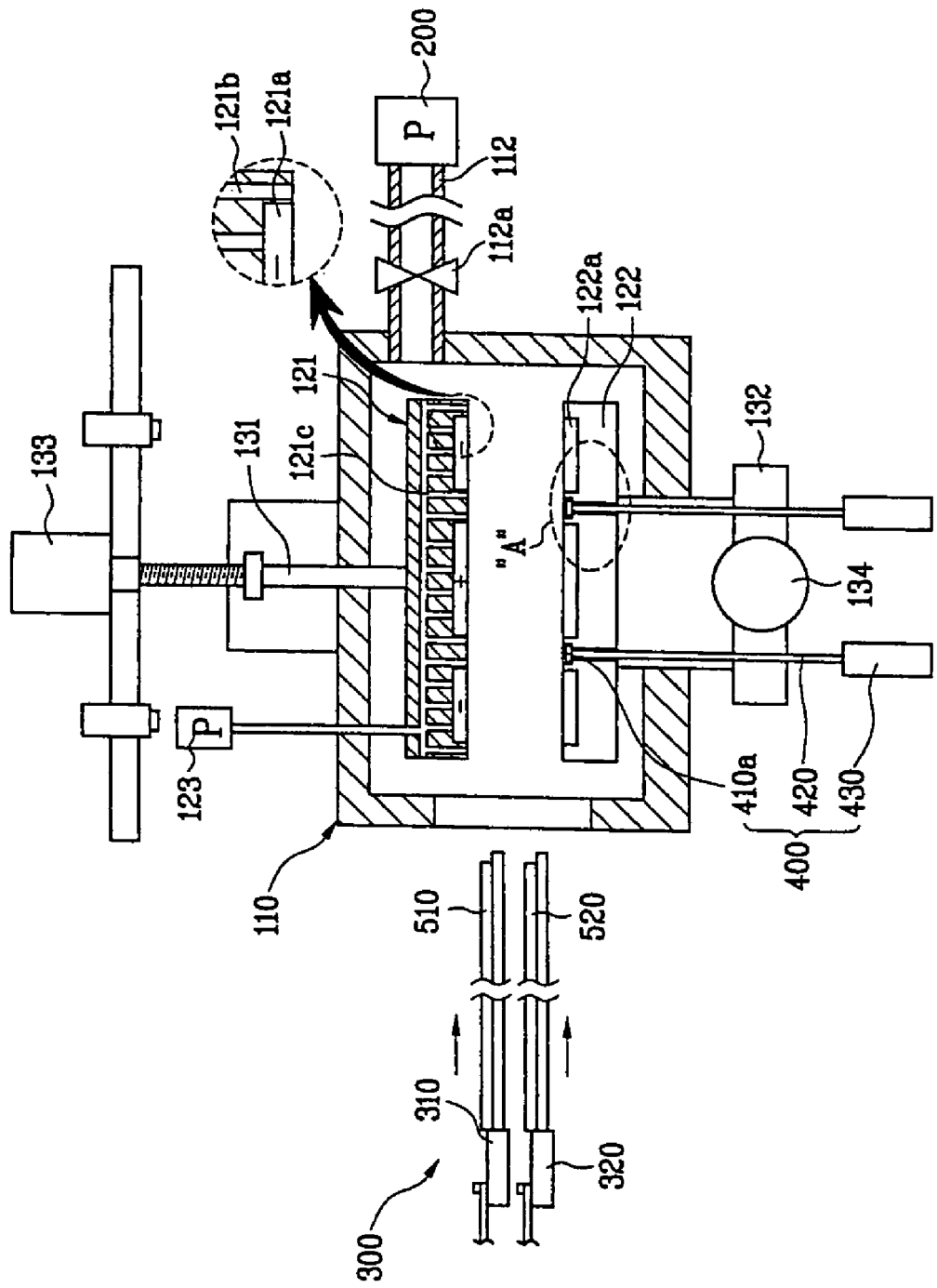
FIG. 3 is a cross sectional view of an exemplary apparatus including a substrate lifting system according to the present invention.

FIG. 3 is a cross sectional view of an exemplary apparatus including a substrate lifting system according to the present invention. In FIG. 3, the apparatus may include a vacuum processing chamber 110, an upper stage 121, a lower stage 122, an upper stage moving system 131 and 133, a lower stage moving system 132 and 134, a vacuum device 200, a loader part 300, and a first substrate lifting system 400.

The vacuum processing chamber 110 may include an air outlet 112 transferring a vacuum force to decrease a pressure at an interior of the vacuum processing chamber 110. The upper and lower stages 121 and 122 may be provided at upper and lower spaces at an interior of the vacuum processing chamber 110, respectively. In addition, the upper and lower stages 121 and 122 receive first and second substrates 510 and 520, which are loaded into an interior of the vacuum processing chamber 110 by first and second arms 310 and 320 of the loader part 300. The first and second substrates 510 and 520 may be affixed to the lower and upper stages 122 and 121, respectively, by an electrostatic force that is generated by the upper and lower stages 121 and 122. In addition, the first and second substrates 510 and 520 may be affixed to the lower and upper stages 122 and 121, respectively, by a vacuum force that is generated the upper and lower stages 121 and 122. The first and second substrates 510 and 520 are maintained to be affixed to the upper and lower stages 121 and 122 during a bonding process. Accordingly, the upper and lower stages 121 and 122 enable a selective movement to perform the bonding process between the first and second substrates 510 and 520.

A lower surface of the upper stage 121 may be provided an electrostatic chuck 121a having a plurality of electrostatic plates buried therein for affixing the second substrate 520 to the upper stage 121. In addition, the upper stage 121 may include a plurality of vacuum holes 121b formed along a circumference of the electrostatic chuck 121a. Each of the vacuum holes 121b may be connected to a vacuum pump 123 by a plurality of pipe lines 121c. The electrostatic chuck 121a may be constructed with at least one pair of the electrostatic plates each having opposite polarities. Alternatively, the electrostatic chuck 121a may be constructed with at least one pair of electrostatic plates each having similar polarities.

An upper surface of the lower stage 122 may be provided an electrostatic chuck 122a having a plurality of electrostatic plates buried therein for affixing the first substrate 510 to the lower stage 122. In addition, the lower stage 122 may include a plurality of vacuum holes (122b in FIGS. 4 and 5A) formed along a circumference of the electrostatic chuck 122a. Like the upper stage 121, each of the plurality of vacuum holes (122b in FIGS. 4 and 5A) may be connected to a vacuum pump (not shown) by a plurality of pipe lines (not shown). The electrostatic chuck 122a may be constructed with at least one pair of the electrostatic plates each having opposite polarities. Alternatively, the electrostatic chuck 122a may be constructed with at least one pair of electrostatic plates each having similar polarities.

Alternatively, an arrangement of the electrostatic chuck 122a and the plurality of vacuum holes (122b in FIGS. 4 and 5A) formed at the upper surface of the lower stage 122 may not be limited to the arrangement of the electrostatic chuck 121a and the plurality of vacuum holes 121b formed at the lower surface of the upper stage 121. The electrostatic chuck 122a and the plurality of vacuum holes (122b in FIGS. 4 and 5A) arranged at the upper surface of the lower stage 122 may be changed to accommodate a geometry of a target substrate and corresponding liquid crystal dispensing areas. However, the plurality of vacuum holes (122b in FIGS. 4 and 5A) formed at the upper surface of the lower stage 122 may not be necessary.

Figure 4:
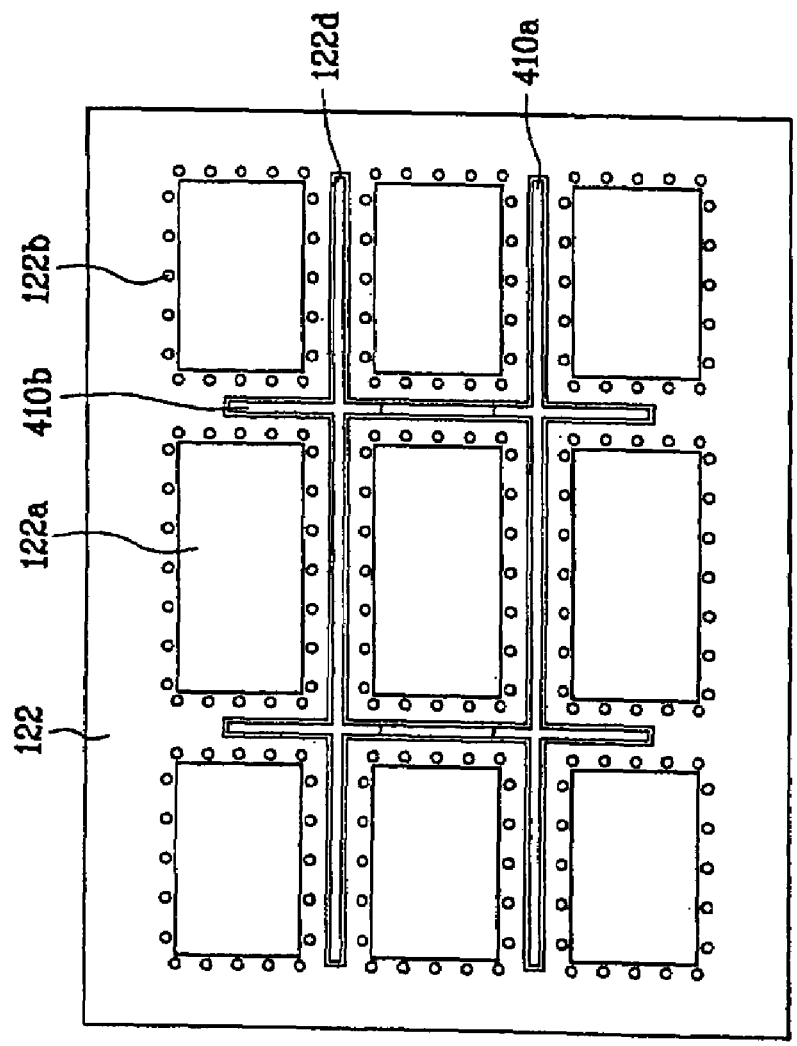
FIG. 4 shows a schematic layout of a lower stage of an exemplary substrate lifting system according to the present invention.
Figure 4:
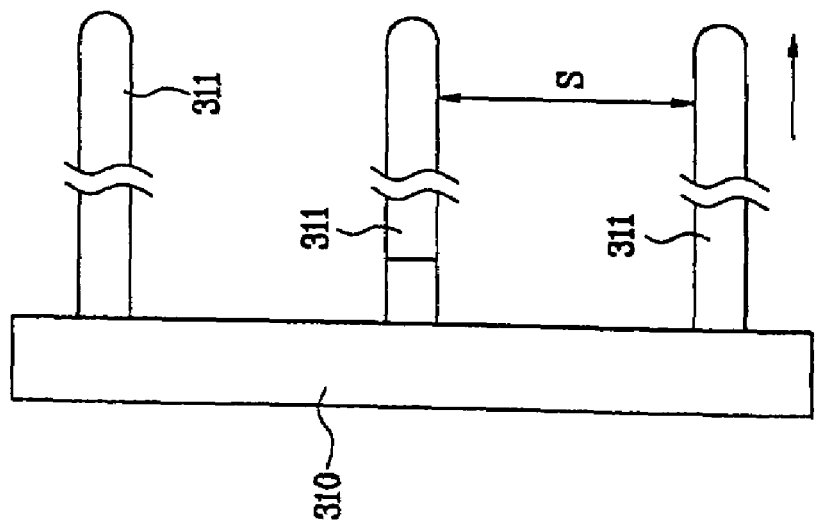
Figure 5A:
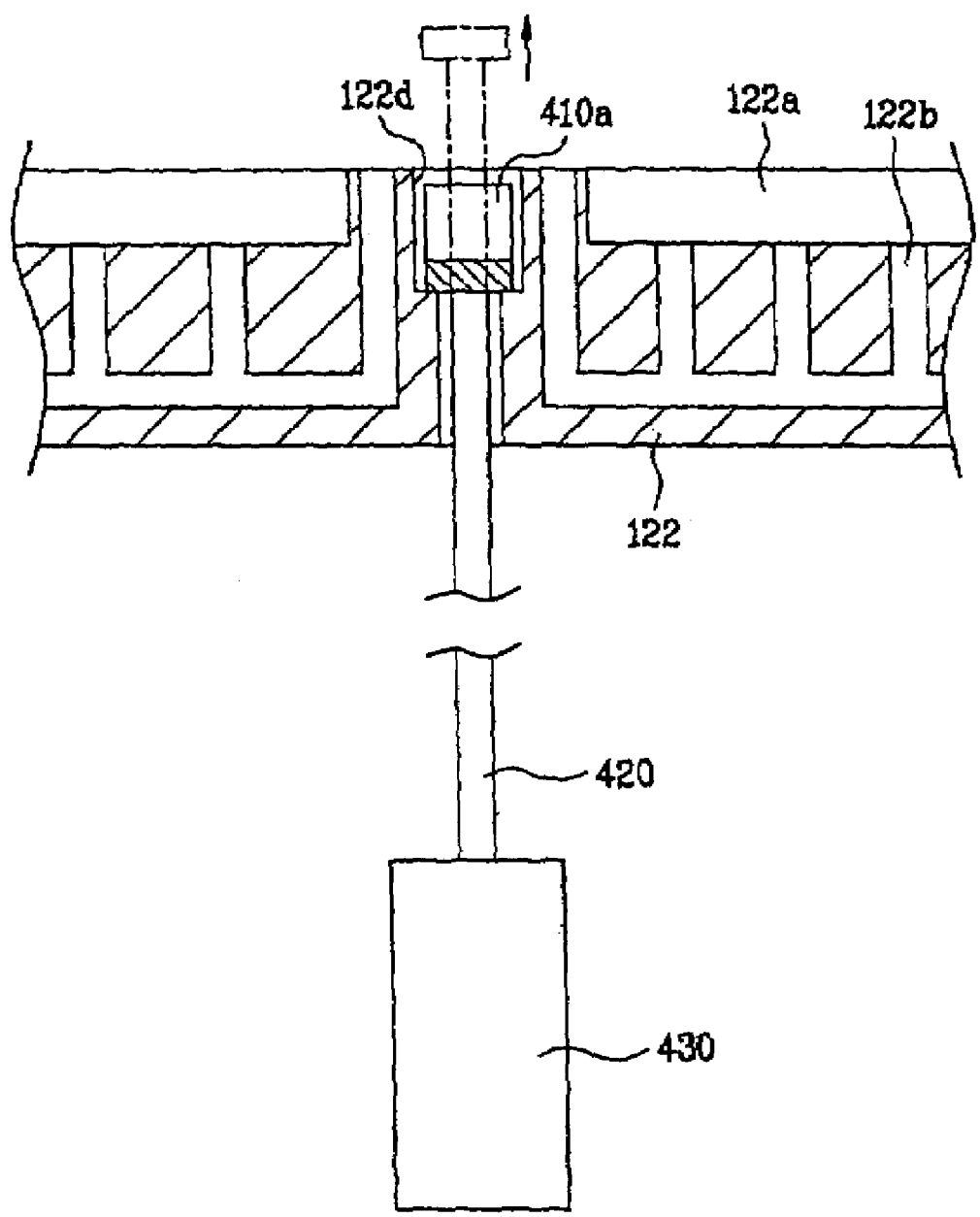
FIG. 5A is an exploded view of a portion A in FIG. 3.

FIG. 4 shows a schematic layout of a lower stage of an exemplary substrate lifting system according to the present invention. In FIG. 4, at least one a first receiving part 122d may be formed at a first portion of the upper surface of the lower stage 122 that corresponds to a dummy area of a first substrate (not shown) that may be placed on the upper surface of the lower stage 122. The location of the first receiving part 122d may be positioned at other portions of the upper surface of the lower stage 122 to prevent displacement of the first substrate (not shown). For example, the first receiving part 122d may be formed at a portion corresponding to a bottom region of the dummy area located between adjacent cell areas formed on an upper surface of the first substrate. Alternatively, the first receiving part 122d may have a geometry corresponding to a recess or a penetrating hole formed through the lower stage 122. In addition, the first receiving part 122d may be constructed as a recessed slot having a penetrating hole formed only at specific portions of the recessed slot.

In FIG. 3, the upper stage moving system may include an upper driving motor 133 axially coupled with the upper stage 121 by a moving axis 131. The lower stage moving system may include a lower driving motor 134 axially coupled with the lower stage 122 by a rotational axis 132. The upper and lower driving motors 133 and 134 may be arranged at an exterior or an interior of the vacuum processing chamber 110.

The loader part 300 may be arranged as a separate system from the vacuum processing chamber 110. The loader part 300 may include a first arm 310 to convey a first substrate 510 upon which a liquid crystal material is dropped, and a second arm 320 to convey a second substrate 520 upon which a sealant is dispensed. Alternatively, although the liquid crystal material may be deposited (i.e., dropped, dispensed) on the first substrate 510, which may be a TFT array substrate, and the sealant may be deposited on the second substrate 520, which may be a color filter (C/F) substrate. Moreover, both the liquid crystal material and the sealant may be deposited on the first substrate 510, which may be a TFT array substrate, and the second substrate 520, which may be a C/F substrate, may not have either of the liquid crystal material or the sealant deposited thereon. Furthermore, both the liquid crystal material and the sealant may be deposited on the first substrate 510, which may be a C/F substrate, and the second substrate 520, which may be a TFT array substrate, may not have either of the liquid crystal material or the sealant deposited thereon. The first substrate 510 may include one of a TFT array substrate and a C/F substrate, and the second substrate 520 may include another one of the TFT substrate and the C/F substrate.

In FIG. 4, the first substrate lifting system 400 may be arranged at the interior of the vacuum processing chamber 110. Alternatively, first substrate lifting system 400 may be arranged at both the exterior and interior of the vacuum processing chamber 110. The first substrate lifting system 400 may include first support parts 410a and second support parts 410b supporting the first substrate 510, a first elevating axis 420 connected to the first support part 410a and extending through the first receiving part 122d from the lower stage 122, and a first driving part 430 to drive the first and second support parts 410a and 410b via the first elevating axis 420. The first support parts 410a may be arranged along a first direction parallel to a loading direction of the first substrate 510, and second support parts 410b arranged along a second direction perpendicular to the loading direction of the first substrate 510.

An arrangement of the first substrate lifting system 400 may be dependent upon a configuration of the lower stage 122, which is also dependent upon the configuration of the first substrate 510. For example, in FIG. 4, the lower stage 122 supports the first substrate 510 that has a 3×3 matrix array of individual regions. Accordingly, the first support parts 410a are arranged to contact each of the dummy areas of the first substrate 510 along the loading direction, and the second support parts 410b are arranged to contact each of the dummy areas of the first substrate 510 along a direction perpendicular to the loading direction, thereby forming a pattern such as a "#".

Alternatively, a first set of the first support parts 410a may be provided to extend along the loading direction to support the first substrate 510. For example, a first set of two first support parts 410a may contact the first substrate 510 along each of the two dummy areas of the first substrate 510 that extend along the loading direction, thereby forming a pattern of "=". Moreover, a second set of second support parts 410b may be provided to extend along the second direction, which is perpendicular to the loading direction of the first substrate 510, to support the first substrate 510. For example, a second set of two second support parts 410b may contact the first substrate 510 along each of the two dummy areas of the first substrate 510 that extend along the second direction, thereby forming a pattern of "||".

The arrangement of the first substrate lifting system 400 may include a single first support part 410a contacting a single dummy region of the first substrate 510 that extends along the loading direction, and a single second support part 410b contacting a single dummy region of the first substrate 510 that extends along the second direction, thereby forming a pattern such as "+".

The arrangement of the first substrate lifting system 400 may include a first set of three first support parts 410a contacting three dummy regions of the first substrate 510 that extends along the loading direction, thereby forming a pattern of "≡". Alternatively, the arrangement of the first substrate lifting system 400 may include a second set of second support parts 410b contacting three dummy regions of the first substrate 510 that extends along the second direction, thereby forming a pattern such as "|||". Moreover, the arrangement of the first substrate lifting system 400 may include a combination of the first set of first support parts 410a and the second set of second support parts 410b.

The first substrate 510 may have a configuration in which a single individual region is provided. Accordingly, the arrangement of the first substrate lifting system 400 may include a first set of two first support parts 410a contacting dummy regions of an outermost perimeter of the first substrate 510 that extends along the loading direction, and second set of two second support parts 410b contacting dummy regions of an outermost perimeter of the first substrate 510 that extends along the second direction, thereby forming a pattern of "□".

The first and second support parts 410a and 410b may include a plurality of protrusions (not shown) that may be formed on upper portions of the first and second support parts 410a and 410b to minimize a contact area between the first substrate 510 and the first and second support parts 410a and 410b. The plurality of protrusions (or the first and second supports 410a and 410b) may include polytetrafluoroethylene or polyetheretherketone, for example, to prevent damage to surface portions of the first substrate 510 that contact the plurality of protrusions, and electrically conductive materials to dissipate any static electricity generated on the first substrate 510.

In FIG. 4, a distance between the first support parts 410a that are arranged along the loading direction of the first substrate 510 is determined to not interfere with a moving path of finger portions of the first arm 310. For example, the first arm 310 is formed to have three finger portions 311 mutually separated by an interval S. Accordingly, each of the first support parts 410a are separated by the interval S, thereby preventing interference with motion of the first arm 310.

Figure 5B:
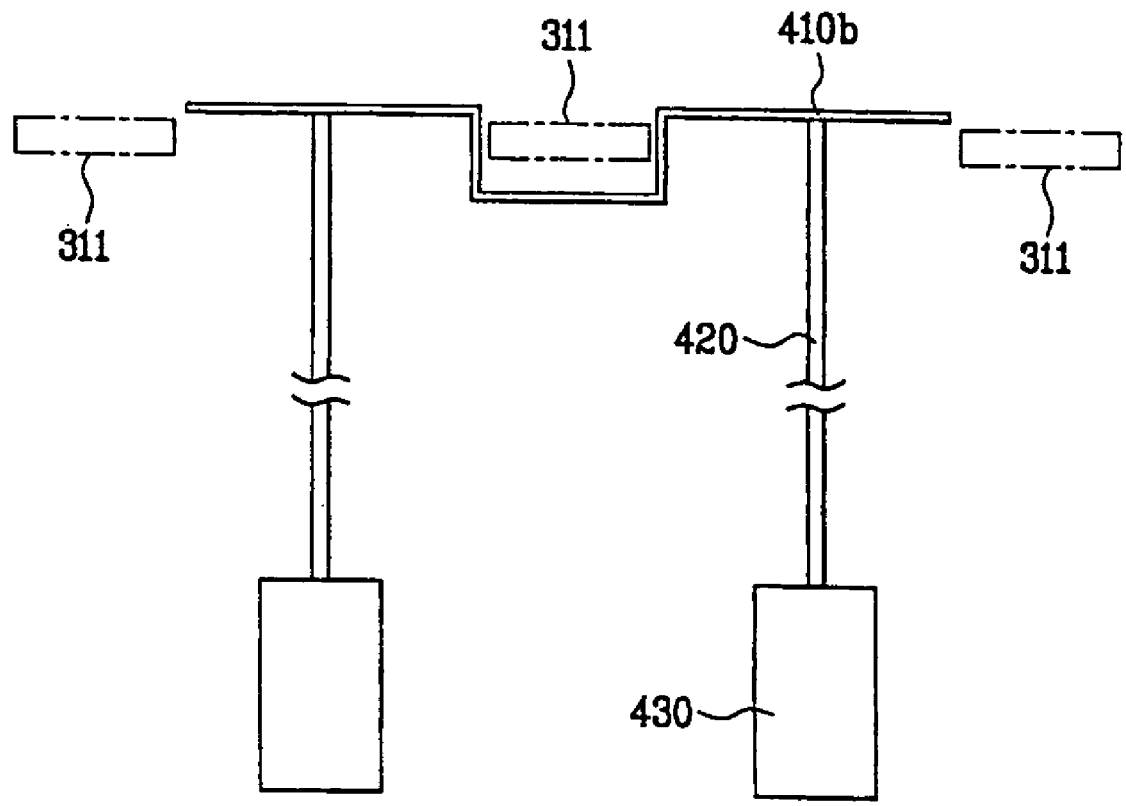
FIG. 5B shows an exemplary substrate lifting system according to the present invention.

FIG. 5B shows an exemplary substrate lifting system according to the present invention. In FIG. 5B, central portions of the second support parts 410b that are provided along the second direction are offset along a downward direction to prevent the interference with the finger portions 311 of the first arm 310. In addition, side portions of the second support parts 410b that contact the first elevating axis 420 are formed having a length so as to not contact outermost finger portions 311 of the first arm 310.

Figure 6:
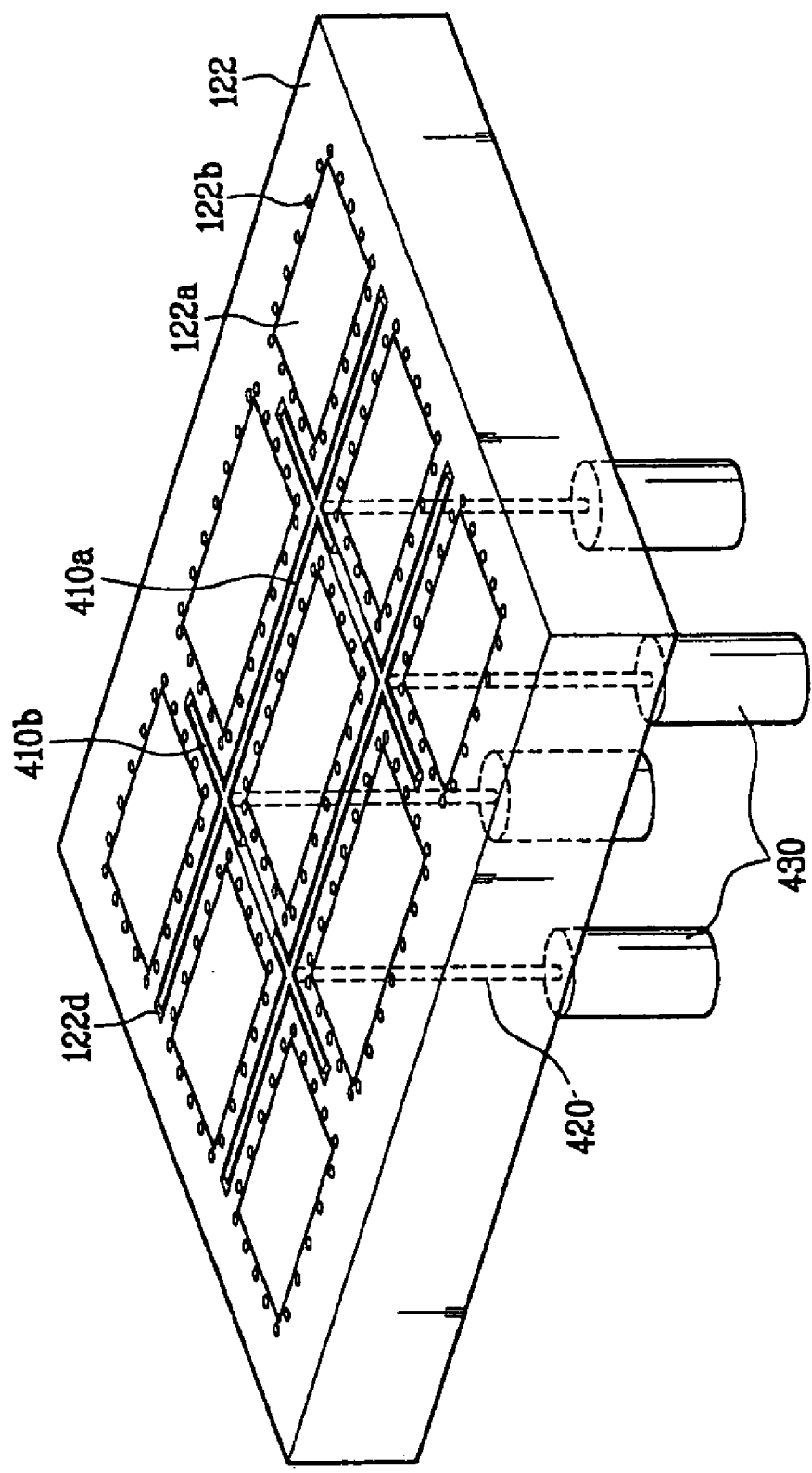
FIG. 6 is a perspective view of an exemplary substrate lifting system according to the present invention.

FIG. 6 is a perspective view of an exemplary substrate lifting system according to the present invention. In FIG. 6, at least two of the first elevating axis 420 axially coupled with the first substrate lifting system 400 and the first driving part 430 may be provided at each of the first and second support parts 410a and 410b. For example, each of the first elevating axis 420 may be connected to corresponding first driving parts 430 that are provided at a crossing portion between the first and second support parts 410a and 410b. Alternatively, a single first driving part 430 may be used to drive the first and second support parts 410a and 410b. Moreover, instead of using the plurality of protrusions (not shown), faces of the first and second support parts 410a and 410b that contact the surface portions of the first substrate 510 may be coated with materials such as polytetrafluoroethylene or polyetheretherketone, for example, to prevent damage caused by the contact between the first and second support parts 410a and 410b and the first substrate 510, and electrically conductive materials to dissipate any static electricity generated on the first substrate 510. The first and second support parts 410a and 410b may have various cross sectional geometries including square, round, and polygonal, for example. Furthermore, the first and second support parts 410a and 410b may be of a solid material or of a hollow material.

In FIG. 3, the first driving part 430 of the first substrate lifting system 400 may include at least a step motor and a cylinder. The step motor may move the cylinder vertically along the direction of the first elevating axis 420 using a pneumatic or hydraulic system. The first driving part 430 may be fixed to a lower space at the interior of the vacuum processing chamber 110, the first driving part 430 may penetrate a bottom of the vacuum processing chamber 110 to be fixed at a location at the exterior of the vacuum processing chamber 110. Thus, interference between the various driving parts may be avoided, and may provide easy installation of each of the driving parts.

Figure 7B:
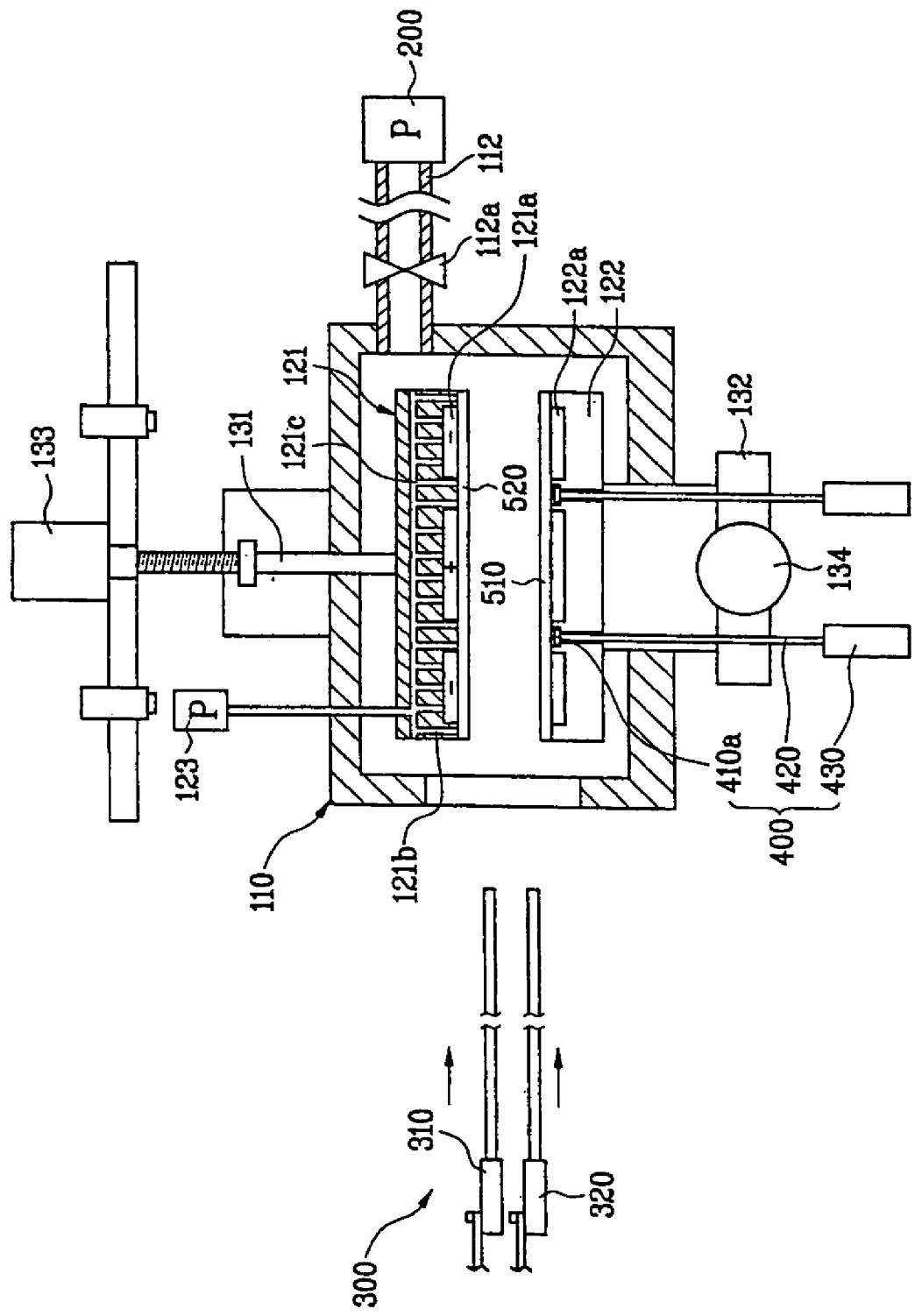
FIG. 7B shows a cross sectional view of the exemplary substrate lifting system according to the present invention where a substrate is loaded onto a lower stage.

A process of loading/unloading substrates using the apparatus according to the present invention is explained schematically with respect to FIGS. 3, 7A, and 7B.

Then, the loader part 300 controls the second arm 320 to load the second substrate 520, which may include the sealant, onto the lower surface of the upper stage 121, and controls the first arm 310 to load the first substrate 510, which has at least the liquid crystal material, onto the upper surface of the lower stage 122.

A substrate loading process includes applying a vacuum force to the plurality of vacuum holes 121b of the upper stage 121. During the substrate loading process, the vacuum pump 123, which is connected to the upper stage 121, produces the vacuum force to the upper stage 121, thereby transferring the second substrate 520 from the second arm 320 and affixing the second substrate 520 to the lower surface of the upper stage 121. The loader part 300 controls the first arm 310 so that the first substrate 510 upon which the liquid crystal material is dropped is loaded onto the upper surface of the lower stage 122.

Figure 8:
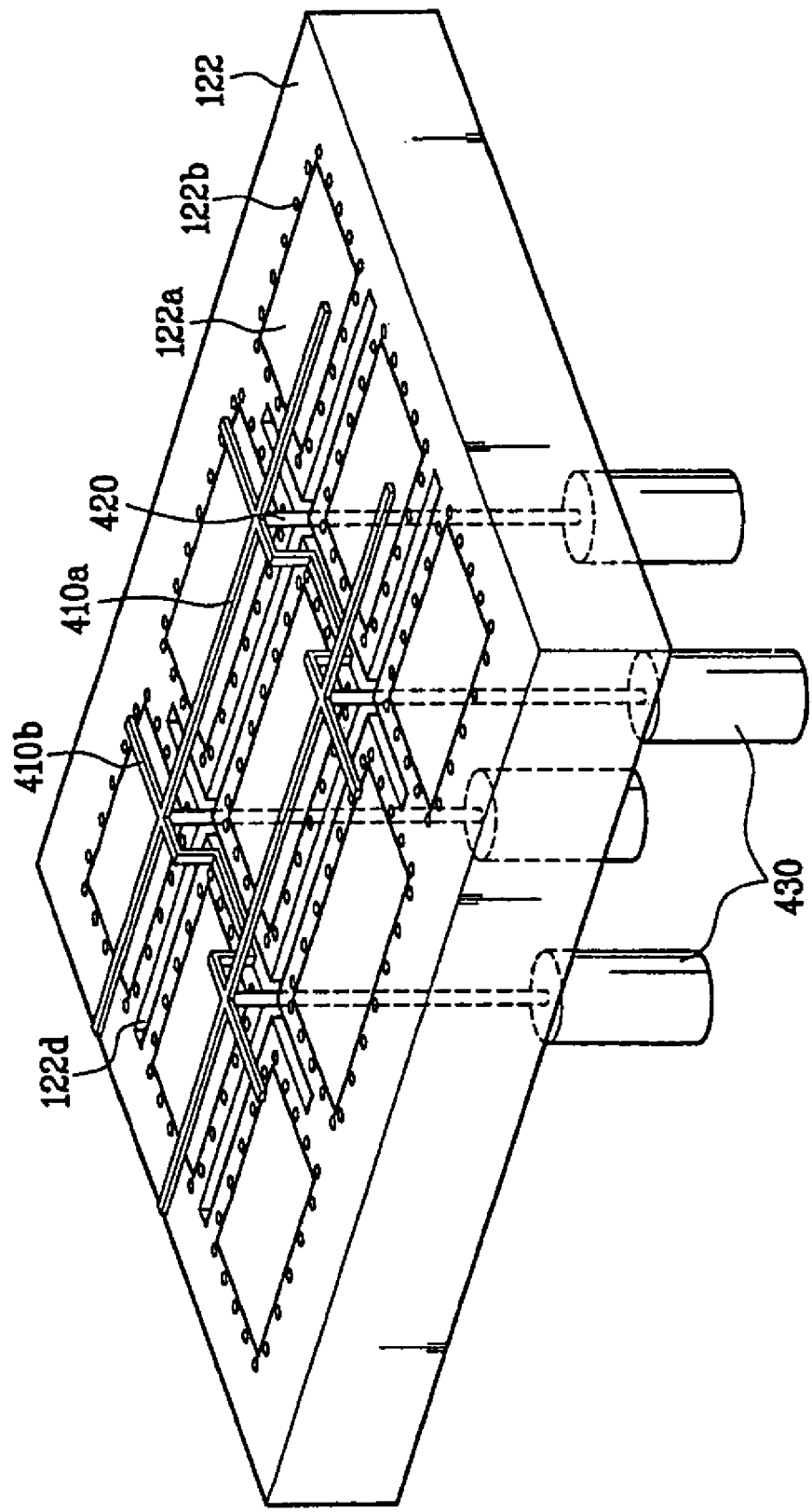
FIG. 8 shows a perspective view of the exemplary substrate lifting system shown in FIG. 7 according to the present invention.

In FIG. 7A, after the substrate loading process, a substrate elevating process includes enabling the first substrate system 400 to move the first elevating axes 420 along an upward direction. The first and second support parts 410a and 410b that are connected to the first elevating axes 420 begin to travel in the upward direction from the first receiving part 122d formed at the upper surface of the lower stage 122, as shown in FIG. 8. Accordingly, the first and second support parts 410a and 410b contact a bottom surface of the first substrate 510 positioned on the first arm 310. The first elevating axes 420 together with the first and second support parts 410a and 410b continue to travel in the upward direction until the first substrate 510 is removed from the first arm 310. Then, the first elevating axes 420 stops the upward direction travel after elevation of a predetermined height.

When the first substrate 510 contacts the upper surfaces of the first and second support parts 410a and 420b, a weight of the first substrate 510 may be distributed and internal stress of the first substrate 510 may be alleviated. Thus, the first substrate 510 is fully supported and any displacement or droop of the first substrate 510 is avoided. Accordingly, the contacts between the first substrate 510 and the upper surfaces of the first and second support parts 410a and 410b may include one of face contacts, line contacts, and point contacts. Alternatively, the contacts between the first substrate 510 and the upper surfaces of the first and second support parts 410a and 410b may include a combination of face contacts, line contacts, and point contacts.

The first and second support parts 410a and 410b may be coated with a material such as polytetrafluoroethylene or polyetheretherketone, for example, to prevent damage to the bottom surface of the first substrate 510 and an electrically conducting material to discharge any static electricity generated on the first substrate 510.

In FIG. 7B, after the substrate elevating process, an extraction process includes extracting the first arm 310 out of the vacuum processing chamber 110 by control of the loader part 300, and a withdrawal process includes enabling the first driving parts 430 to withdrawal the first elevating axes 420 in a downward direction to be placed into the first receiving part 122d of the lower stage 122. Accordingly, the bottom surface of the first substrate 510 contact the upper surface of the lower stage 122.

After the extraction process and the withdrawal process, a substrate transfer process includes enabling the vacuum pump (not shown) that is connected to the lower stage 122 to transfer a vacuum force to the plurality of vacuum holes (122b in FIG. 5B). Accordingly, the bottom surface of the first substrate 510 is affixed to the upper surface of the lower stage 122 by the vacuum force generated by the vacuum pump (not shown). Alternatively, the substrate transfer process may include applying a potential to the electrostatic plates of the electrostatic chuck 122a of the lower stage 122, thereby affixing the bottom surface of the first substrate 510 to the upper surface of the lower stage 122.

After the substrate transfer process, a vacuum processing chamber process includes enabling the vacuum device 200 to reduce a pressure of the interior of the vacuum processing chamber 110. Then, once a desired vacuum pressure is attained, a bonding process of the first and second substrates 510 and 520 is performed by enabling the upper drive motor 133 to move the upper stage 121 in the downward direction, or by enabling the lower drive motor 134 to move the lower stage 122 in the upward direction. Alternatively, both the upper and lower drive motors 133 and 134 may be enabled, thereby moving the upper and lower stages 121 and 122 in the downward and upward direction, respectively.

Alternatively, an alignment process may be performed prior to the bonding process. The alignment process may include a certification procedure that the upper and lower substrates 510 and 520 are aligned with each other, and may include optical and computer systems. If the first and second substrate 510 and 520 are not certified as being aligned, adjustment systems may be enabled to move the upper stage 121 along an X-Y plane, and rotate the rotational axis 132 of the lower stage 122. Alternatively, both the upper and lower stages 121 and 122 may be moved along an X-Y plane in addition to the rotation of the lower stage 122.

Once the first and second substrates 510 and 520 have been bonded, a detachment process and an unloading process may be performed, wherein one of the first arm 310 and the second arm 320, may unload the bonded first and second substrates 510 and 520 now residing upon the upper surface of the lower stage 122.

The detaching process includes removing the vacuum force from the plurality of vacuum holes (122b in FIG. 5A), or removing the potential from the electrostatic plates of the electrostatic chuck 122a. The lower stage unloading process may include driving the first substrate lifting system 400 using the driving parts 430 to move the first elevating axes 420 and the first and second support parts 410a and 410b in the upward direction. Accordingly, the bonded substrates are removed from the upper surface of the lower stage 122, and the driving parts 430 continue to move the first elevating axes 420 and the first and second support parts 410a and 410b until the bonded substrates are elevated above the upper surface of the lower stage 122 by a predetermined amount. As previously described, the driving parts 430 may be replaced by a single driving part (not shown).

Once the detaching and lower stage unloading processes have been completed, a bonded substrate unloading process includes the loader part 300 controlling one of the first arm 310 and the second arm 320 to place the second substrate 520 into the interior of the vacuum processing chamber 110. Then, a loading position of the second arm 320 is arranged under the bonded substrates that have been previously moved along the upward direction by the first substrate lifting system 400. Accordingly, the first driving parts 430 of the first substrate lifting system 400 are driven to move the first elevation axes 420 and the first and second support parts 410a and 410b along a downward direction. Thus, the bonded substrates that were placed on the first and second support parts 410a and 410b are now placed on the second arm 320, and the first and second support parts 410a and 410b continue to move along the downward direction to be received into the first receiving part 122d of the lower stage 122.

Once the bonded substrates unloading process has been completed, a bonded substrates extraction process includes the second arm 320 being withdrawn from the interior of the vacuum processing chamber 110 by control of the loader part 300. After completion of the bonded substrates unloading process, the loading process of the first substrate 510 by the first arm 310 and first substrate lifting system 400 may begin, as described above.

Figure 9:
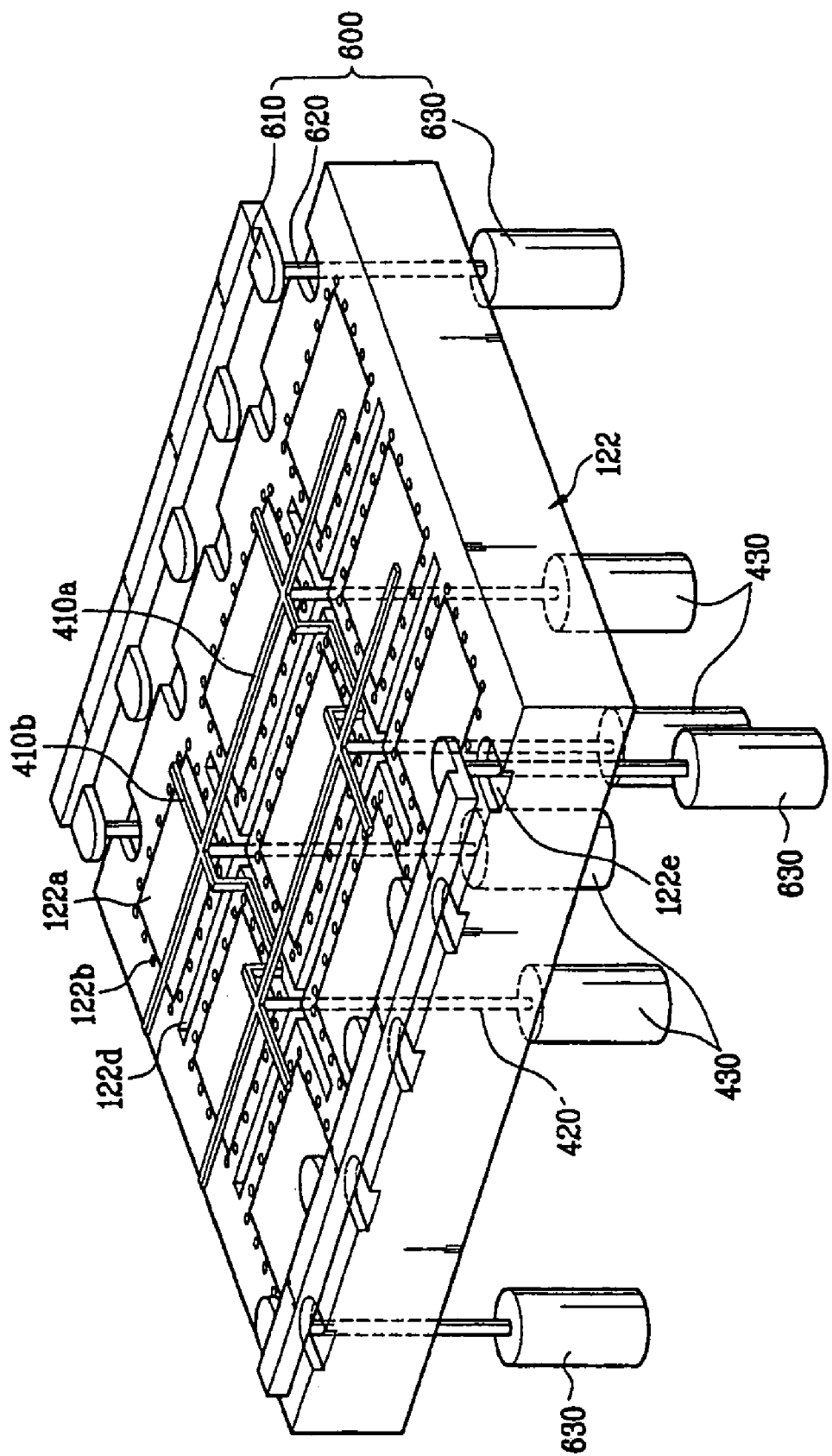
FIG. 9 shows a perspective view of an exemplary substrate lifting system according to the present invention.

FIG. 9 shows a perspective view of an exemplary substrate lifting system according to the present invention. In FIG. 9, at least one a second receiving part 122e may be formed at opposing edge portions along an upper circumference of the lower stage 122 in a direction perpendicular to the loading/unloading direction of the first substrate 510. The second receiving parts 122e may be formed of a concave recess or a penetrating form. In addition, a second substrate lifting system 600 may be received by the second receiving parts 122e to support circumferential edge portions of the first substrate 510 during the substrate loading process or support circumferential edge portions of the bonded substrates during the bonded substrates unloading process. Accordingly, the displacement or droop of the first substrate or bonded substrate is further prevented.

The second substrate lifting system 600 may be received inside the second receiving part 122e while being positioned initially at both sides of the lower stage 122. In addition, the second substrate lifting system may include at least second support part 610 that supports a corresponding bottom edge portion of the first substrate 510, a second elevating axis 620 built into one body of the second support part 610 to move the second support part 610 along the vertical direction, and a second driving part 630 connected to the second elevating axis 620 to move the second elevating axis 620 along the vertical direction. Accordingly, the second receiving part 122e may be formed to have a predetermined length along a portion corresponding to the dummy area of the first substrate 510 when placed along the corresponding circumferential upper edge portions of the lower stage 122. Furthermore, the second support part 610 may be formed to have a length corresponding to a shape of the second receiving part 122e to support a circumference of the first substrate 510. Specifically, the second support part 610 may be formed having a bent shape along a first face to provide support to the bottom of the first substrate 510 and a second face supporting a side of the first substrate 510. In addition, a previously described above, a face contacting the first substrate 510 may be coated with a coating material to prevent the substrate damage caused by the contact between the second support part 610 and the first substrate 510. The coating material may be the same as the first and second support parts 410*a* and 410*b*, polytetrafluoroethylene or polyetheretherketone, for example, and an electrically conductive material to discharge any static electricity generated on the first substrate 510.

The second elevating axis 620 and second driving part 630 may be formed to have the first elevating axis 420 and the first driving part 430. Moreover, the second support part 610 may include a single body formed to engage an entire circumference of the lower stage 122. The plurality of the second support parts 610 may be provided and separated from each by a predetermined interval, wherein the interval is sufficient to prevent the first substrate from exceeding a minimum displacement or droop limit. Accordingly, ends of the second support parts 610 may include a single body with at least one second elevating axis 620 and second driving part 630 being are provided at the ends of the second support parts 610, thereby enabling a smooth operation of the respective second support parts 610.

An operational sequence of the second substrate lifting system 600 will now be explained with respect to the first substrate lifting system 400. The second driving part 630 of the second substrate lifting system 600 operates simultaneously in connection with the operation of the first driving part 430 of the first substrate lifting system 400, thereby moving the second elevating axis 620 and second support part 610 along the vertical direction. The simultaneous operation of the second driving part 630 and the first driving part 430 enables support of the circumferential portions of the first substrate 510, as well as the bonded substrates when the first substrate 510 and the bonded substrates are loaded and unloaded, respectively.

An exemplary method of loading the first substrate 510 by the simultaneous operation of the first and second substrate lifting systems 400 and 600 are described as follows. First, the first lifting system 400 is enabled to carry out the loading process of the first substrate 510, much like the above described process. Sequentially, the upward movement of the first substrate lifting system 400 is performed, the first substrate 510 to be loaded onto the upper surface of the lower stage 122 is placed on the first substrate lifting system 400, and the first substrate lifting system 400 moves downward to place the first substrate 510 on the upper surface of the lower stage 122.

Second, the first and second substrate lifting system 400 and 600 are simultaneously moved in the upward direction, the first substrate 510 to be loaded onto the upper surface of the lower stage 122 is placed on the first and second substrate lifting systems 400 and 600, and the downward movements of the first and second substrate lifting systems 400 and 600 are simultaneously moved in the downward direction to place the first substrate 510 on the upper surface of the lower stage 122. The process of loading the first substrate 510 may be performed while the central and circumferential portions of the first substrate 510 are simultaneously supported, thereby preventing the displacement or droop of the first substrate 510.

Third, the second substrate lifting system 600 is moved along the upward direction, the first substrate 510 to be loaded onto the upper surface of the lower stage 122 is placed on the second substrate lifting system 600, the first substrate lifting system 400 continues moving along the upward direction to support the first substrate 510 on the second substrate lifting system 600, and the downward direction movement of the first and second substrate lifting system 400 and 600 are preformed to place the first substrate 510 on the upper surface of the lower stage 122. Accordingly, after supporting the first substrate 510 by the second substrate lifting system 600 and before the unloading process of the first arm 310, the first substrate lifting system 400 moves along the upward direction to support the first substrate 510 together with the second lifting system 600. In addition, after the first substrate 510 is unloaded by the first arm 310 and supported by the second substrate lifting system 600, the first substrate support system 400 moves along the upward direction to support the first substrate 510 together with the second substrate lifting system 600. The process prevents interference between the first and second support parts 410*a* and 410*b* and the first arm 310 during the loading process of the first substrate 510, as well as avoiding the bending portions of the first support parts 410*a* and 410*b*.

Fourth, movement along the upward direction of the first substrate lifting system 400 is performed, the first substrate 510 to be loaded onto the upper surface of the lower stage 122 is placed on the first and second substrate lifting systems 400 and 600 moves along the upward direction to support the first substrate 510 together with the first substrate lifting system 400, the first and second substrate lifting system 400 and 600 are simultaneously moved along the downward direction to place the first substrate 510 onto the upper surface of the lower stage 122.

The above process of loading the first substrate 510 using the first and second substrate lifting system 400 and 600 according to the present invention may not be limited to the above-mentioned description, but can be achieved various methods as well. Accordingly, the substrate lifting system of the apparatus according to the present invention has the following advantages and effects.

It will be apparent to those skilled in the art that various modifications and variations can be made in the apparatus and method for manufacturing liquid crystal display devices, method for using the apparatus, and device produced by the method of the present invention without departing from the spirit or scope of the invention. Thus, it is intended that the present invention covers the modifications and variations of this invention provided they come within the scope of the appended claims and their equivalents.

What is claimed is:

1. An apparatus for manufacturing a liquid crystal display device, comprising:
    a vacuum processing chamber;
    upper and lower stages disposed within the vacuum processing chamber; and
    a substrate lifting system disposed at a lower portion of the vacuum processing chamber for lifting a substrate on one of the upper and lower stages,
    wherein the substrate lifting system includes a plurality of support parts for supporting the substrate, each capable of extending from a first position within a receiving part of the lower stage to a second position above an upper surface of the lower stage, wherein the plurality of support parts includes a plurality of first supports extending along a first direction and a plurality of second parts includes a plurality of first supports extending along a second direction perpendicular to the first direction, wherein the plurality of first supports and the plurality of second supports are connected at intersections, and wherein each of the plurality of first supports include a pair of side portions and central portion that is offset from the side portion along a third direction perpendicular to the first and second directions.

2. The apparatus according to claim 1 wherein upper surfaces of the supports parts are recessed from the upper surface of the lower stage at the first position.

3. The apparatus according to claim 1, wherein the plurality of first supports and the plurality of second supports are connected at intersections.

4. The apparatus according to claim 3, wherein the substrate lifting system includes a plurality of elevating axis and a plurality of driving parts, each elevating axis having a first end connected to the intersections of the first and second supports and a second end connected to one of the driving parts.

5. The apparatus according to claim 1 wherein the central portion is disposed between adjacent ones of the plurality of elevating axis.

6. The apparatus according to claim 1, wherein the substrate lifting system includes a plurality of support parts disposed along opposing side portions of the lower stage.

7. The apparatus according to claim 6, wherein the substrate lifting system includes a plurality of elevating axis and a plurality of driving parts, each of elevating axis having a first end connected to one of the support parts and a second end connected to one of the driving parts.

8. The apparatus according to claim 7, wherein each of the plurality of support parts disposed along one of the opposing side portions of the lower substrate are interconnected and each of the plurality of support parts disposed along another one of the opposing side portions of the lower substrate are interconnected.

9. The apparatus according to claim 8, wherein each of the support parts are disposed within recesses along the opposing side portions of the lower stage at a first position of the elevating axis, and each of the support parts are disposed above an upper surface of the lower stage along the opposing side portions of the lower stage at a second position of the elevating axis.

10. The apparatus according to claim 1, wherein the substrate lifting system includes a first substrate lifting system that extends to a first position above an upper surface of the lower stage from a central portion of the lower stage and a second substrate lifting system that extends to a second position above the upper surface of the lower stage from opposing side portions of the lower stage.

11. The apparatus according to claim 10, wherein the first substrate lifting system retracts to a third portions below the upper surface of the lower stage.

12. The apparatus according to claim 10, wherein the second substrate lifting system retracts to a fourth position at the upper surface of the lower stage.

13. The apparatus according to claim 10, wherein the second substrate lifting system operates simultaneously with the first substrate lifting system.

14. The apparatus according to claim 1, wherein the substrate lifting system extends through the lower stage to position the substrate on the lower stage.

15. The apparatus according to claim 14, wherein the upper stage includes at least one of an electrostatic chuck and a plurality of vacuum holes.

16. The apparatus according to claim 14, wherein the upper stage includes an electrostatic chuck and vacuum holes.

17. The apparatus according to claim 1, wherein the substrate lifting system retracts through the lower stage to position the substrate on the lower stage.

18. The apparatus according to claim 17, wherein the lower stage includes at least one of an electrostatic chuck and a plurality of vacuum holes.

19. The apparatus according to claim 17, wherein the lower stage includes an electrostatic chuck and vacuum holes.

20. The apparatus according to claim 19, wherein the electrostatic chuck includes a plurality of electrostatic plates individually positioned to correspond to individual display regions of the substrate.

21. The apparatus according to claim 20, wherein the vacuum holes are positioned along circumferential portions of each of the electrostatic plates.

22. The apparatus according to claim 21, wherein the substrate lifting system is positioned to extend between the electrostatic plates.

23. A method for manufacturing a liquid crystal display device, comprising the steps of:
a first loading process including:
moving a lifting system along a first direction to a first position;
placing a first substrate on the lifting system;
moving the lifting system along a second direction to a second position; and
placing the first substrate on an upper surface of a lower stage,
wherein the lilting system contacts the first substrate within an area between display regions of the first substrate, and wherein the contacts between the lifting system and the first substrate includes at least one of face, line, and point contacts.

24. The method according to claim 23, wherein the substrate is positioned over the lifting system before the lifting system is moved along the first direction.

25. The method according to claim 23, further comprising steps of:
a second loading process including:
placing a second substrate on a lower surface of an upper stage.

26. The method according to claim 25, wherein the second loading process is performed before the first loading process.

27. The method according to claim 26, further comprising:
moving at least one of the upper stage along the second direction and the lower stage along the first direction; and
bonding the first substrate and the second substrate together.

28. The method according to claim 27, further comprising:
moving the lower stage along the second direction;
extending the lifting system along the first direction to raise the bonded first and second substrates from the lower stage; and
removing the bonded first and second substrate from the lifting system.

29. The method according to claim 27, further comprising performing an alignment process to certify alignment of the first and second substrates.

30. The method according to claim 29, wherein the alignment process is performed before the first and second substrates are bonded together.

31. The method according to claim 29, wherein the alignment process is performed after the first and second substrates are bonded together.

32. The method according to claim 29, wherein one of the upper and lower stages are moved to mutually align the first and second substrates.

33. The method according to claim 32, wherein the upper stage is moved along an X-Y plane.

34. The method according to claim 32, wherein the lower stage is moved about a rotational axis.

35. The method according to claim 34, wherein the lower stage is moved along an X-Y plane.

36. The method according to claim 28, further comprising: moving the lifting system along the second direction; and performing the second loading process.

37. The method according to claim 23, wherein the contacts between the lifting system and the first substrate include an electrically conductive material.

38. The method according to claim 23, wherein the placing the first substrate on the upper surface of the lower stage includes affixing the first substrate using at least one of vacuum force and electrostatic force.

* * * * *